US008975583B2

(12) United States Patent
Tinkler et al.

(10) Patent No.: US 8,975,583 B2
(45) Date of Patent: Mar. 10, 2015

(54) 3D STACKED UNCOOLED IR SENSOR DEVICE AND METHOD

(75) Inventors: Rosanne H. Tinkler, Lexington, MA (US); Richard J. Blackwell, Jr., Dracut, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 435 days.

(21) Appl. No.: 13/415,203

(22) Filed: Mar. 8, 2012

(65) Prior Publication Data

US 2013/0235210 A1   Sep. 12, 2013

(51) Int. Cl.
*G01J 5/00*   (2006.01)
(52) U.S. Cl.
USPC ...................................................... 250/338.1
(58) Field of Classification Search
USPC ........................................................ 250/338.1
See application file for complete search history.

(56) References Cited

U.S. PATENT DOCUMENTS

| 7,067,345 | B2 | 6/2006 | Kalvesten et al. |
| 8,743,207 | B2 * | 6/2014 | Boulanger et al. ............ 348/164 |
| 2011/0266443 | A1 * | 11/2011 | Schimert et al. ........... 250/338.4 |
| 2012/0092390 | A1 * | 4/2012 | Ludwig et al. ................ 345/690 |

FOREIGN PATENT DOCUMENTS

WO    WO 2011/107486 A1 *   9/2011

OTHER PUBLICATIONS

Wilke, M. et al., "Prospects and Limits in Wafer-Level-Packaging of Image Sensors"; IEEE, 2011, pp. 1901-1907.

* cited by examiner

*Primary Examiner* — David Porta
*Assistant Examiner* — Mindy Vu
(74) *Attorney, Agent, or Firm* — Maine Cernota Rardin; David A. Rardin

(57) ABSTRACT

A 3D wafer-integration uncooled infrared (IR) microbolometer focal plane array (FPA) sensor includes a first die with an FPA of uncooled IR microbolometers, a second die signal-processing layer. The dies are vertically aligned, stacked with 3D wafer bonding, and interconnected. Interconnection include vertical electrical interconnects. Separate optimized manufacturing processes are used for die, so that additional processing costs of the FPA die are leveraged and 3D integration is completed at wafer level, minimizing total device cost and maximizing die count per wafer.

18 Claims, 8 Drawing Sheets

WAFER LEVEL PACKAGING COMPONENTS

SEPARATED PIXELS AND PROCESSING CIRCUITRY
FIG. 1

3D INTEGRATION WITH TSV
FIG. 2

WAFER LEVEL PACKAGING COMPONENTS
FIG. 3

400

SIMPLIFIED SEPARATE PIXEL AND PROCESSING CIRCUITRY DIE WAFERS
FIG. 4

SIMPLIFIED TSVs AND INTERCONNECT POINTS
FIG. 5

SIMPLIFIED 3D UNCOOLED IR SENSOR COMPONENTS
FIG. 6

SIMPLIFIED STACKED 3D UNCOOLED IR SENSOR
FIG. 7

FLOW CHART
FIG. 8

3D STACKED UNCOOLED IR SENSOR DEVICE AND METHOD

FIELD OF THE INVENTION

The invention relates to uncooled infrared focal plane arrays and their manufacture using 3D wafer integration.

BACKGROUND OF THE INVENTION

Uncooled infrared (IR) sensors are larger and more expensive than visible chip cameras, making them too large and unaffordable for low cost sensing applications. The IR focal plane portion is fabricated with bolometers integrated onto a die which also includes peripheral signal processing circuits. This decreases the available area for bolometers. While each die is large enough to accommodate both bolometers and other circuits, there are fewer die per wafer, driving up total cost. With one die hosting both the bolometers and the signal processing, the bolometer fill factor is less than 70% when leaving area for signal processing circuits. The wafer processing for the signal circuits requires more expensive silicon manufacturing processes than required for addressing bolometers alone. However, the signal circuit area is typically only 30% of total die area. Again, increasing the total cost.

There is a need for lower cost uncooled IR focal plane array sensors and manufacturing methods.

SUMMARY OF THE INVENTION

In embodiments, costs are decreased by performing all critical assembly steps at the wafer level, including the package, sensor and video processing chip. Bolometers are fabricated on one die without any additional processing circuitry. The fill factor of bolometer to die area is very high; therefore the additional processing cost of the bolometer is more highly leveraged. The required signal processing circuits are on a separate die that is the same size. The cost of the complex silicon processes required for the signal processing circuits is now also leveraged across the whole die. The die that is devoted to signal processing can now have added features without adversely affecting the fill factor of the bolometers. The signal processing die can now include amplifiers, an A/D converter to digitize the IR scene, and also include non-uniformity correction for gain and offset on the same die. The two die are designed to be vertically stacked, in embodiments, with through silicon vias (TSVs). In embodiments, the 3D integration is completed at the wafer level to minimize total cost and maximize the count of die per wafer.

TSV interconnect methods can include diffusion bonding, soldering, and adhesive bonding to bond wafers/chips with TSV interconnects.

In diffusion bonding, a thin metal bonding layer (formed for example, from copper tin, indium, gold, nickel, silver, palladium, palladium-nickel alloy or titanium) is applied to the respective surface of semiconductor components that are to be bonded. When the components are brought together under the correct conditions of temperature and pressure, the two metal bonding layers diffuse into each other to form an intermetallic compound (IMC) and create the bond. Diffusion bonding can produce a good quality bond that is reliable, but may need a high bonding temperature.

Adhesive bonding is an option in which an adhesive layer is provided on the surfaces to be bonded together. As an example, chips are bonded using conductive adhesives such as anisotropic conductive film (ACF) or anisotropic conductive adhesive (ACA). For another example of adhesive bonding, wafers are bonded by adhesive and electrical connections are made by a conductive liquid.

An example of a soldering method, solder is applied at the junctions of vias on semiconductor components to be stacked. Soldering does not require such high temperatures as diffusion bonding and can still produce a good reliable bond. Solder type bonding methods comprise Al/Ge, Au/Sn, Au/Ge, and Cu/Sn.

Because of their small size and low power requirements, 3D stacked uncooled IR sensors can be integrated into handheld units, rifle sights, helmets or eyeglasses, and can support extended activities. Additionally, captured images can be shared instantly for analysis, surveillance, and reconnaissance.

Embodiments provide a wafer-integration uncooled infrared (IR) microbolometer focal plane array (FPA) sensor device comprising at least a first layer comprising at least one FPA of uncooled IR microbolometers; at least a second layer comprising a least one signal processing circuit; wherein the at least a first layer and the at least a second layer are aligned and interconnected; and wherein separate optimized manufacturing processes are used for each of the at least a first layer and the at least a second layer, whereby additional processing cost of the at least a first layer is leveraged, minimizing total device cost and maximizing die count per wafer. In another embodiment, the at least a first layer is a first die vertically aligned and 3D stacked with and connected to the at least a second layer by through silicon vias (TSVs), wherein the at least a second layer is a second die. In continuing embodiments, the at least a first layer comprises at least a portion of a read out integrated circuit (ROIC); and the at least a second layer comprises at least a portion of an ROIC. In still other embodiments, the interconnections comprise external interconnects. For subsequent embodiments, the at least a second layer comprises pixel level corrections, lower ROIC, pixel signal processing, and row based pipeline flow. In ongoing embodiments, the at least a second layer comprises an application-specific integrated circuit (ASIC); and the at least a second layer comprises mixed signal CMOS. For a further embodiment, the at least a first layer comprises a first wafer and the at least a second layer comprises a second wafer; wherein the first and second wafers are vertically stacked and interconnected by 3D wafer bonding and integration techniques at wafer level, the integration completed at wafer level. In following embodiments, the uncooled microbolometers of the at least a first layer comprise amorphous silicon. For additional embodiments, the external interconnects comprise wire bonds; and the external interconnects comprise circuit board interconnects. In still further embodiments, the at least a first microbolometer layer and the at least a first signal processing layer are aligned side by side; and comprise a thermal interposer between the at least a first layer and the at least a second layer. Yet other embodiments comprise a discrete electronics layer adjacent the at least a second layer, on side of the at least a second layer opposite the at least a first layer; and comprise vacuum packaging at wafer level.

Other embodiments provide a method of manufacturing a 3D wafer-integration uncooled infrared (IR) microbolometer focal plane array (FPA) sensor comprising the steps of fabricating on a first wafer, at least a first die comprising an uncooled IR microbolometer FPA; fabricating on a second wafer, at least a second die comprising signal-processing circuits; aligning the at least a first die and the at least a second die; and interconnecting the at least a first die and the at least a second die; wherein separate optimized manufacturing processes are used for each of the fabricating on a first wafer and the fabricating on a second wafer steps; and whereby additional processing cost of the at least a first die FPA is leveraged, minimizing total device cost and maximizing die count per wafer. Still other embodiments comprise separating from the first wafer, the at least a first die; separating from the second wafer, the at least a second die; vertically aligning the at least a first die and the at least a second die; stacking and interconnecting the at least a first die and the at least a second die using 3D wafer bonding techniques. In continuing embodiments, the step of aligning comprises stacking the first wafer and the second wafer; wherein the first and second wafers are vertically stacked and interconnected by 3D wafer bonding and integration techniques at wafer level, wherein 3D integration is completed at wafer level. Another embodiment further comprises a step of providing a discrete electronics layer adjacent the at least a second die, on the side opposite the at least a first die; providing a wafer-lid adjacent the at least a first die, on the side opposite the at least a second die; and providing a thermal interposer between the at least a first die and the at least a second die. Yet another embodiment further comprises the step of providing at least one IR optic adjacent to the side of the wafer-lid opposite the at least a second die.

Further embodiments provide a 3D wafer-integration uncooled infrared (IR) microbolometer focal plane array sensor camera comprising at least one IR optic component; an IR transparent wafer-lid comprising a low-activation temperature vacuum getter adjacent the IR optic; an uncooled infrared microbolometer focal plane array (FPA) silicon layer adjacent the wafer-lid; the FPA layer comprising 12 micron pitch single-layer vanadium oxide (VOx) bolometer components; the FPA layer comprising a multiplexer; the FPA layer comprising read out integrated circuits (ROIC); the FPA layer comprising high density through silicon via (TSV) 3D interconnects; at least one low-conductivity silicon thermal interposer comprising a getter and high density TSV 3D interconnects, the low-conductivity thermal interposer adjacent the FPA layer on the side of the FPA layer opposite the wafer-lid; the least one low-conductivity thermal interposer providing thermal management and redistribution between the FPA layer and the signal processing portions of the sensor; an application-specific integrated circuit (ASIC) layer adjacent to the low-conductivity thermal interposer; wherein the dimensions of the ASIC layer in the plane of the ASIC layer are approximately equal to the dimensions of the FPA wafer layer in the plane of the FPA layer; the ASIC layer comprising signal processing circuits; the signal processing circuits of the ASIC layer comprising video processing circuits; the video processing circuits of the ASIC layer comprising amplifiers; the video processing circuits of the ASIC layer comprising at least one A/D converter whereby the IR scene produced by the sensor is digitized; the video processing circuits of the ASIC layer comprising non-uniformity correction (NUC) for gain; the video processing circuits of the ASIC layer comprising NUC for offset; a discrete electronics layer substrate adjacent to the ASIC layer; wherein the planes of the components and the layers are parallel and the components and the layers are aligned and stacked whereby the planar dimensions of the sensor camera are determined by the dimensions of the component or the layer having the greatest planar dimensions, thereby reducing the footprint of the sensor; wherein vacuum packaging is at wafer level, the location of the TSVs is outside the vacuum packaging; and wherein separate optimized manufacturing processes are used for each of the components and the layers, whereby additional processing cost of the FPA layer is leveraged and 3D integration is completed at the wafer level, minimizing the total cost and maximizing the die count per wafer.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The following detailed description provides example embodiments of the presently claimed invention with references to the accompanying drawings. The description is intended to be illustrative and not limiting the scope of the present invention. Embodiments are described in sufficient detail to enable one of ordinary skill in the art to practice the subject invention. Other embodiments may be practiced with some variations without departing from the spirit or scope of the subject invention.

Figure 1:
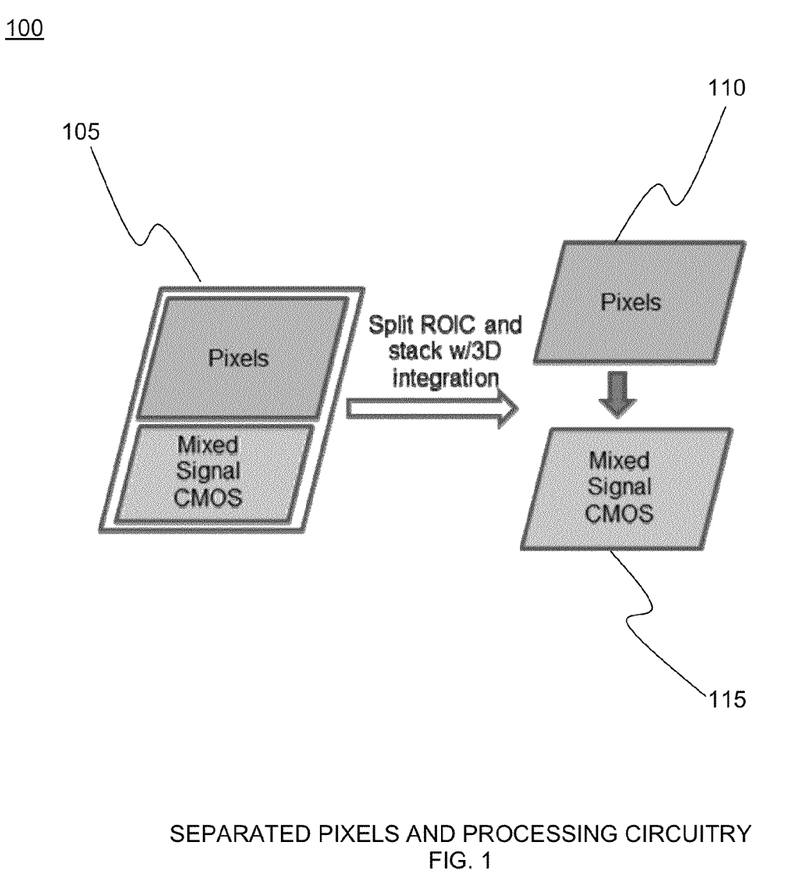
FIG. 1 depicts vertically stacked focal plane array chips, configured in accordance with one embodiment of the present invention.

FIG. 1 depicts vertically stacked focal plane array chips 100. The sensing pixels portion of a chip is separated from the signal processing portion, leaving two smaller chips that are stacked using 3D wafer bonding techniques to form the complete focal plane array. Silicon FPA sensing pixels and CMOS circuitry to control the pixels and provide basic image corrections 105 are separated. The separated pixel portion 110 and the mixed signal CMOS processing portion 115 result in two smaller chips that are stacked using 3D wafer bonding techniques to form the complete FPA. This allows each portion (pixels and signal processing) to be independently optimized for performance and manufacturing cost and reduces the footprint of the final FPA.

Figure 2:
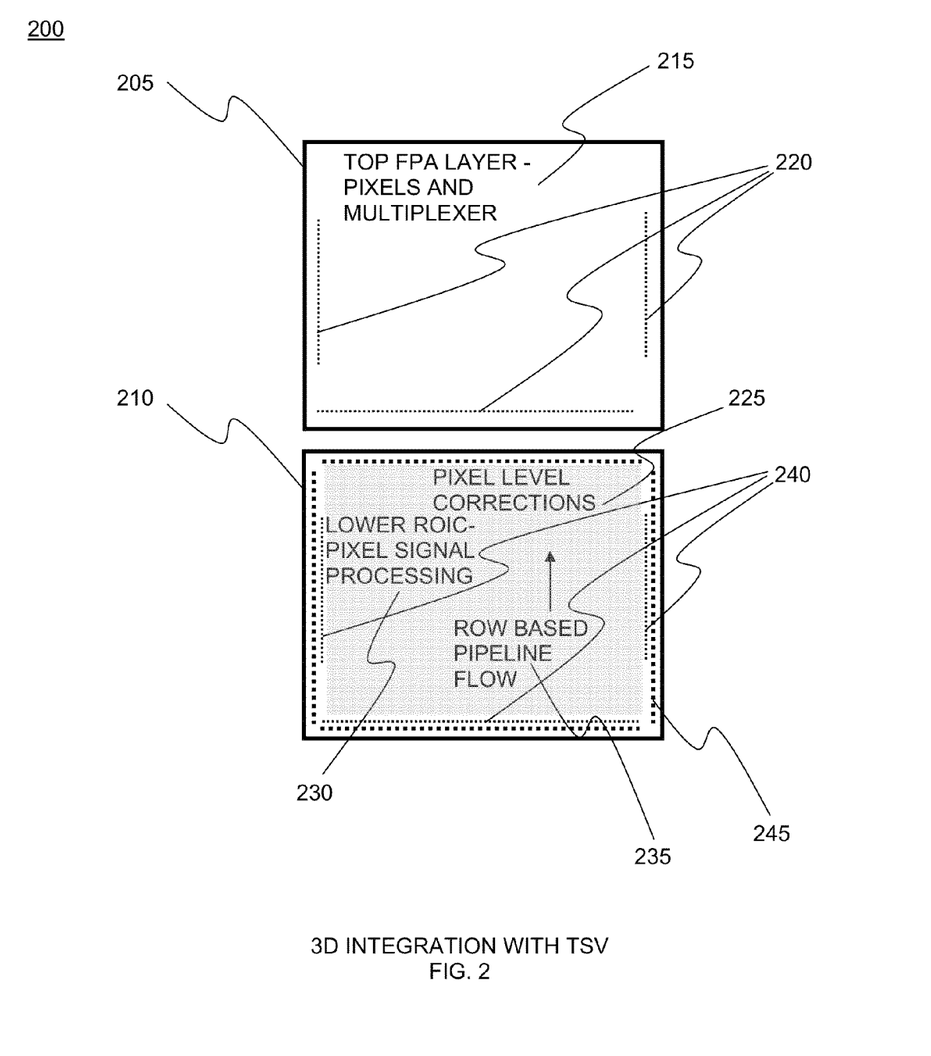
FIG. 2 depicts simplified 3D wafer integration components using through silicon vias techniques, configured in accordance with one embodiment of the present invention.

FIG. 2 depicts a sample type of 3D wafer integration 200. For embodiments, several types of 3D wafer integration approaches can be used to manufacture this invention. One embodiment uses through silicon via (TSV) techniques to provide vertical interconnects between the two portions of the stacked FPA. FPA portion 205 comprises top FPA layer-pixels and multiplexer 215 as well as TSVs 220 to signal processing layer 210. Signal processing layer 210 comprises pixel level corrections 225, and lower ROIC-pixel signal processing 230. Some embodiments can comprise row-based pipeline flow 235. Signal processing layer 210 also comprises TSVs 240 to FPA portion 205. Additional connections 245 in signal processing layer 210 can comprise bond pads in embodiments that provide for testing and bonding purposes. For embodiments, bond pads are closer to the die edge than the TSVs.

Figure 3:
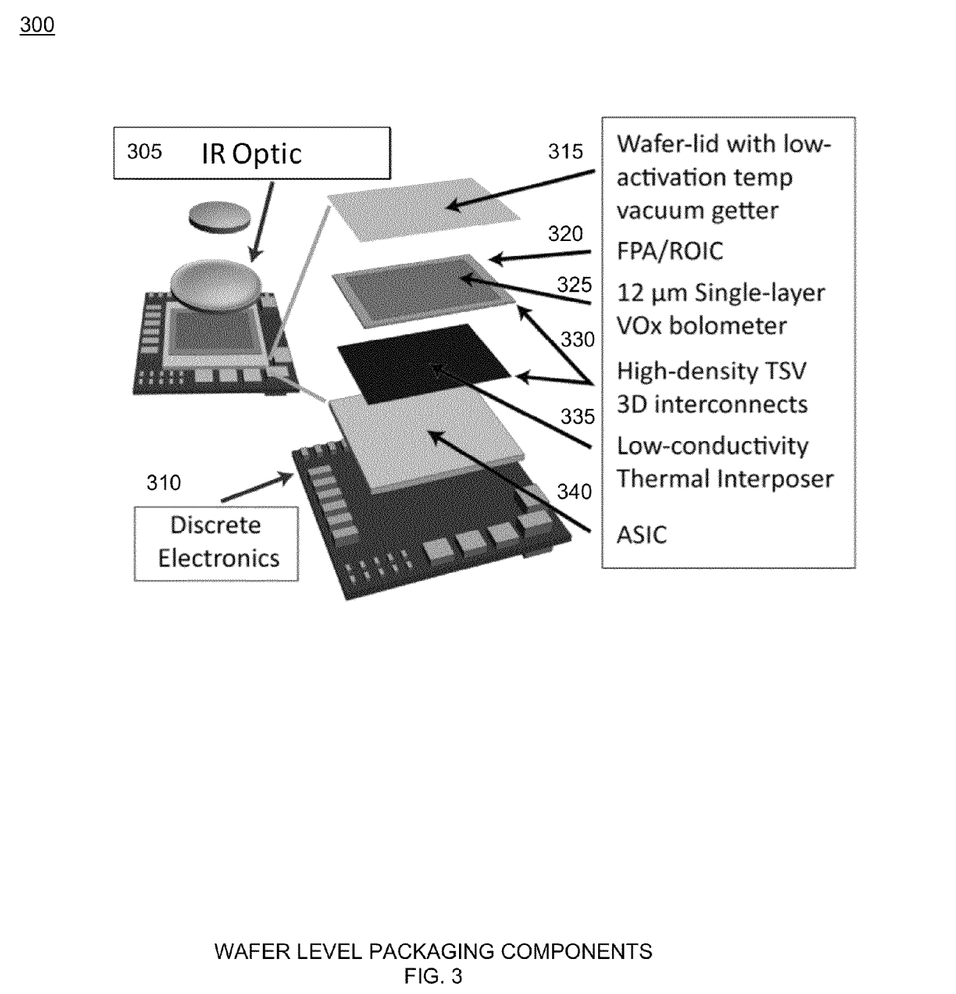
FIG. 3 depicts wafer level sensor components, configured in accordance with one embodiment of the present invention.

FIG. 3 depicts wafer level sensor embodiment 300. For embodiments, features include wafer level vacuum packaging and use of interposers as thermal management and redistribution layers between the pixel and signal processing portions of the 3D integrated FPA. This allows full wafer level manufacturing up to the point where a complete uncooled chip camera can be realized with a minimal set of additional electronics and optics. Sensor 300 comprises IR optic(s) 305, discrete electronics component layer 310, wafer-lid with low-temperature vacuum getter 315, FPA/ROIC 320 comprising any generation of bolometer including, but not limited to, 12, 17, 25, and 28 micron pitch single-layer VOx or amorphous silicon bolometers 325, high-density TSV 3D interconnects 330, low-conductivity thermal interposer 335, and ASIC component layer 340.

Figure 4:
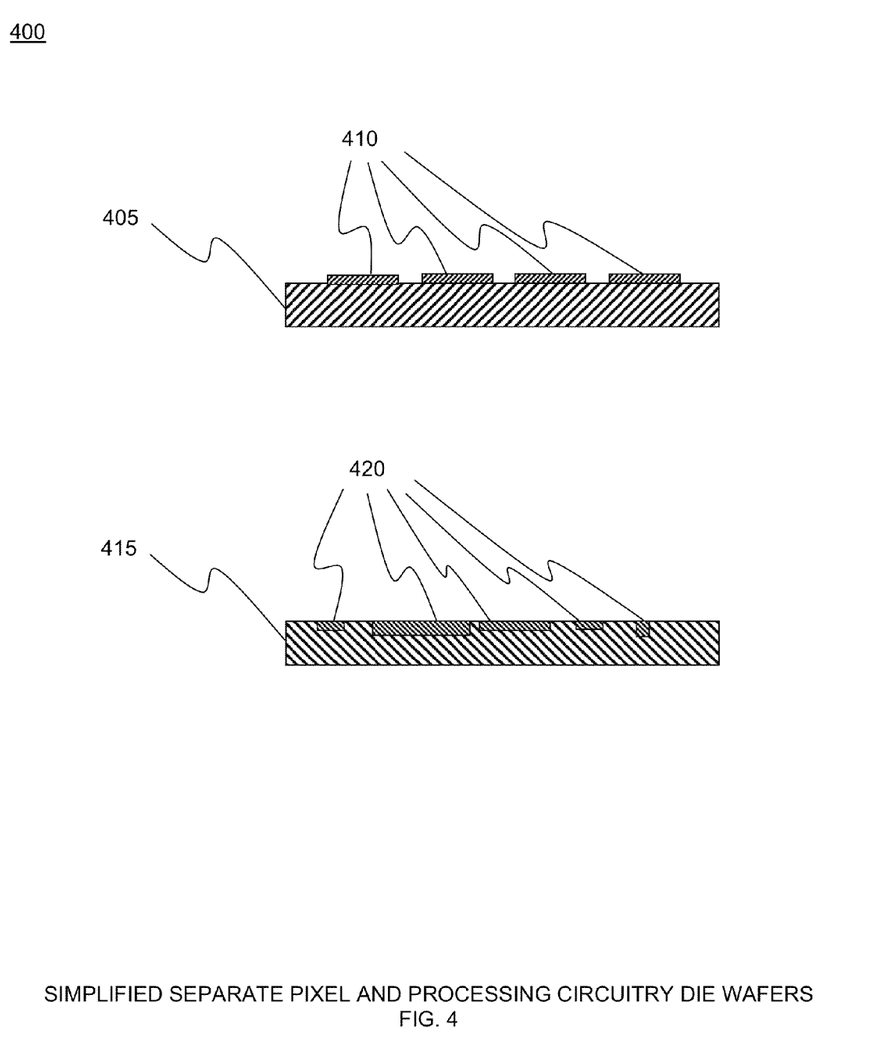
FIG. 4 depicts simplified separate pixel and processing circuitry die wafers, configured in accordance with one embodiment of the present invention.

FIG. 4 depicts simplified separate pixel and processing circuitry die wafers embodiment 400. FPA wafer substrate 405 comprises uncooled IR microbolometer elements 410. Signal processing wafer substrate 415 comprises signal processing circuitry components 420. Wafer 415 can be oriented with component side up or down.

Figure 5:
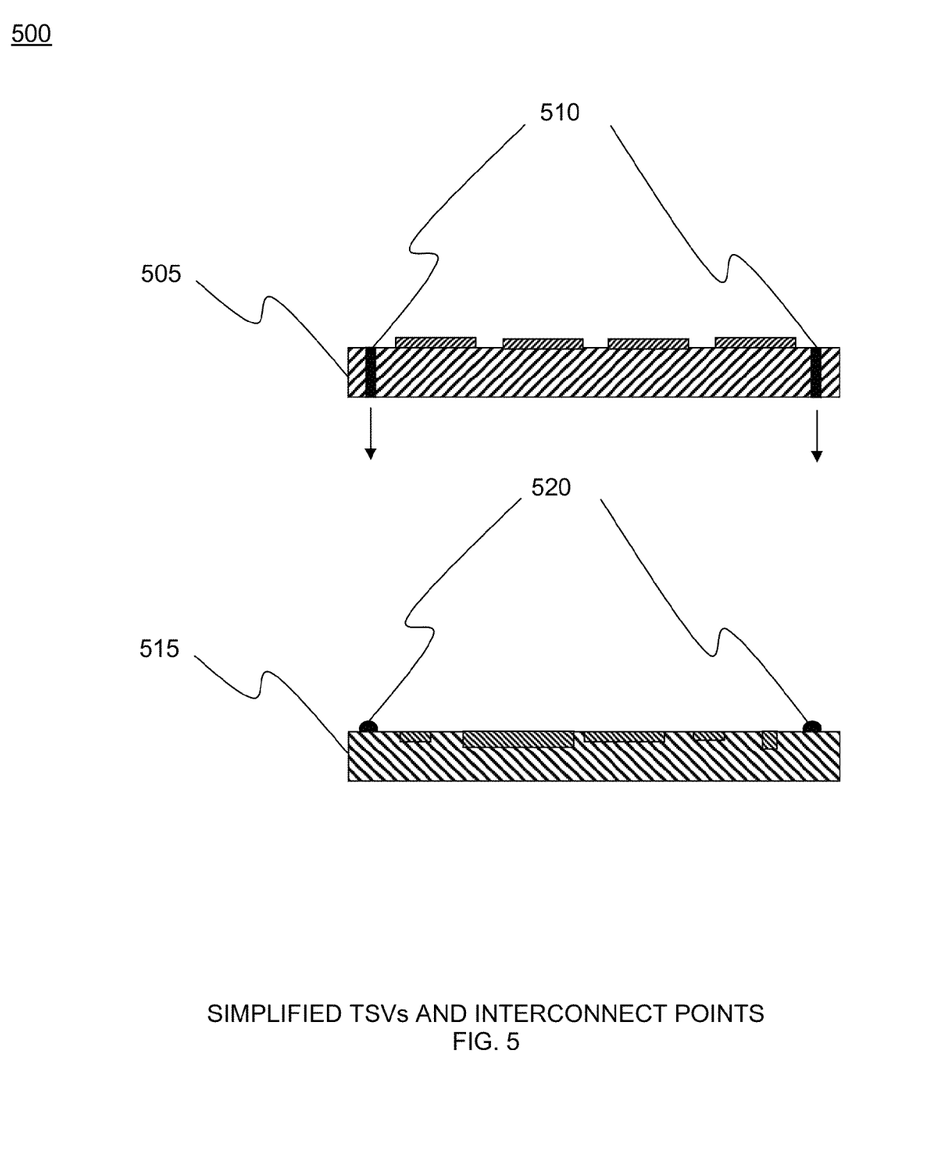
FIG. 5 depicts simplified separate pixel and processing circuitry die wafers with TSVs and interconnect points, configured in accordance with one embodiment of the present invention.

FIG. 5 depicts simplified separate pixel and processing circuitry die wafers with TSVs and interconnect points embodiment 500. FPA wafer substrate 505 comprises TSV interconnect elements 510. Signal processing wafer substrate 515 comprises TSV interconnect elements 520.

Figure 6:
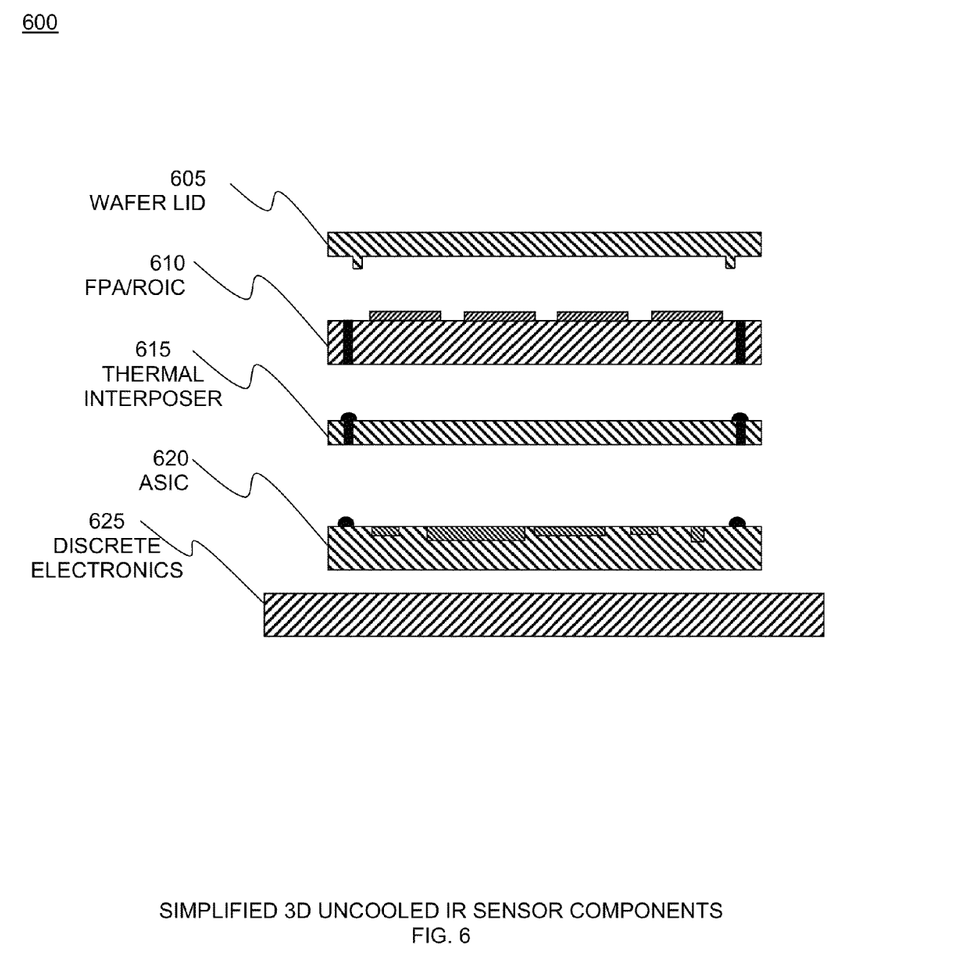
FIG. 6 depicts simplified 3D uncooled IR sensor components, configured in accordance with one embodiment of the present invention.

FIG. 6 depicts simplified 3D uncooled IR sensor components embodiment 600. Components comprise wafer lid 605, FPA/ROIC wafer substrate 610, thermal interposer 615, ASIC signal processing wafer layer 620, and discrete electronics layer 625. For embodiments, the lid is a single piece with an extension downward to seal to the wafer below. For embodiments, this is made by etching cavities into a silicon wafer, leaving a ridge that is the seal surface. For embodiments, the sealing point is inside the die compared to the TSVs. This leaves the TSVs outside the vacuum formed by the sealed lid wafer (in case the TSVs leak).

Figure 7:
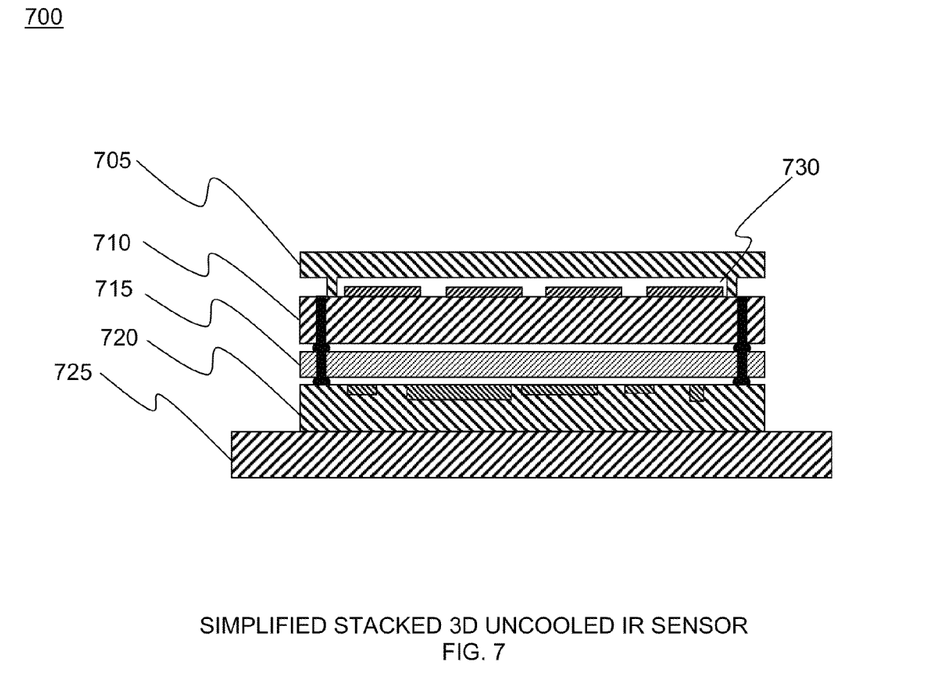
FIG. 7 depicts a simplified stacked 3D uncooled IR sensor, configured in accordance with one embodiment of the present invention.

FIG. 7 depicts a simplified stacked 3D uncooled IR sensor embodiment 700. Components comprise wafer lid 705, FPA/ROIC wafer substrate 710, thermal interposer 715, ASIC signal processing wafer layer 720, discrete electronics layer 725, and vacuum 730 contained by the seal between lid 705 and the bolometer substrate. For embodiments, the optics comprise a conventional lens, or are fabricated using wafer level approaches. In either case, for embodiments, they are subsequently attached to the sensor.

Figure 8:
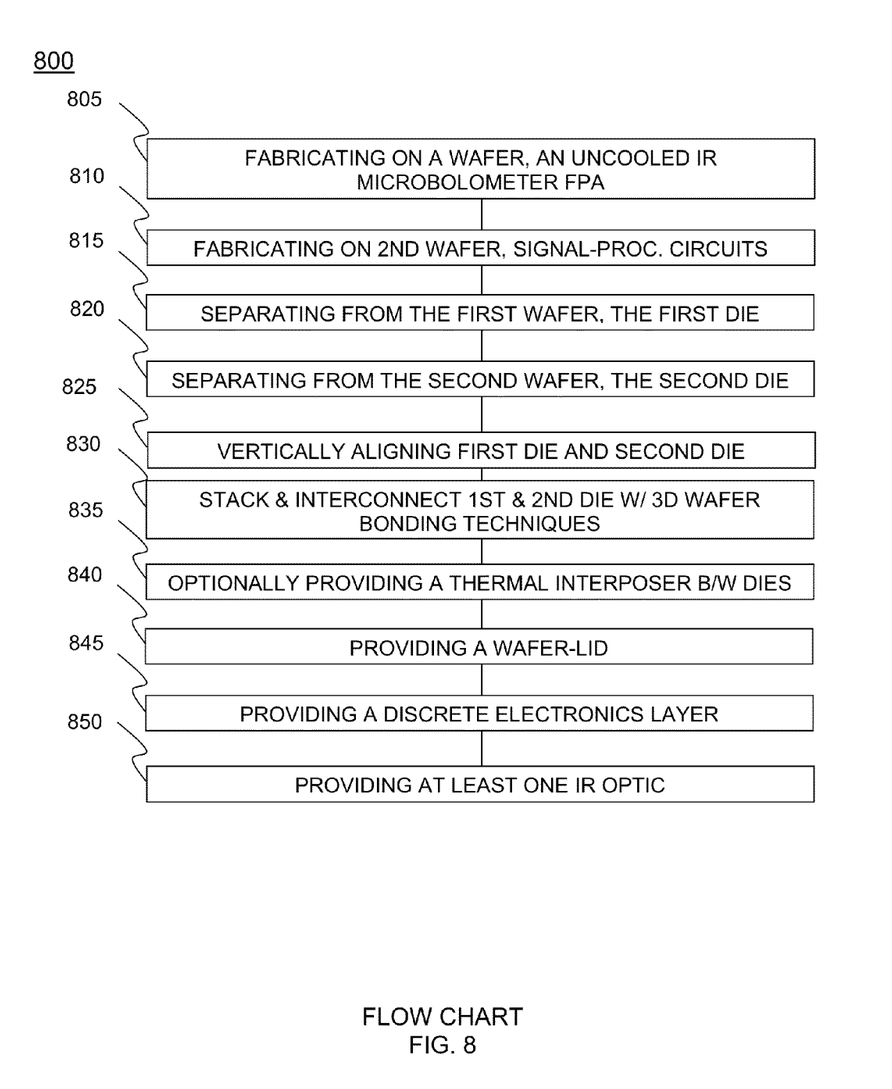
FIG. 8 depicts a flowchart for a method for manufacturing a 3D wafer-integration uncooled infrared (IR) microbolometer focal plane array (FPA) sensor configured in accordance with one embodiment of the present invention.

FIG. 8 depicts a flowchart 800 for a method for manufacturing a 3D wafer-integration uncooled infrared (IR) microbolometer focal plane array (FPA) sensor. Embodiments comprise fabricating on a first wafer, at least a first die comprising an uncooled IR microbolometer FPA 805; fabricating on a second wafer, at least a second die, signal-processing circuits 810; separating from the first wafer, the at least a first die 815; separating from the second wafer, the at least a second die 820; vertically aligning the at least a first die and the at least a second die 825; stacking and interconnecting the at least a first die and the at least a second die using 3D wafer bonding techniques 830; optionally providing a thermal interposer between the at least a first die and the at least a second die 835; providing a wafer-lid adjacent the at least a first die, on side opposite the at least a second die 840; providing a discrete electronics layer adjacent the at least a second die, on side opposite the at least a first die 845; and providing at least one IR optic adjacent to side of the wafer-lid opposite the at least a second die 850. In embodiments, assembly (for example, lid attached to substrate) occurs in a vacuum and that level of vacuum is sealed in during the process and provides for wafer-level vacuum packaging. The order of steps may be varied. For embodiments, the vacuum lid goes on last, whereby the bolometer substrate is mechanically stable.

In embodiments, steps comprise stacking complete wafers and then separating the die. Other embodiments comprise first separating the die and then stacking them. Some embodiments comprise stacking an interposer between the bolometer and signal processing wafer.

Embodiments of the stacked chip IR camera can be realized by either stacking complete wafers and then separating the die, or first separating the die and then stacking them. For embodiments, the "wafer" bonding term designates the wafer to wafer bonding then separating die. Embodiments comprise stacked chip cameras both with and without an interposer.

As mentioned, embodiments comprise both wafer to wafer bonding assembly with TSV and die to die bonding assembly with TSV. Further embodiments comprise splitting the bolometer and circuits, and assembling them by stacking them with external interconnects including, but not limited to, wirebonds. Additional embodiments comprise assembling components side by side and interconnecting them with wirebonds and/or circuit board interconnect whereby the benefits of splitting the functions to optimize the cost and function are still provided for IR FPAs even if the die are not stacked with TSVs.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

What is claimed is:

1. A wafer-integration uncooled infrared (IR) microbolometer focal plane array (FPA) sensor device comprising:
    at least a first layer comprising at least one FPA of uncooled IR microbolometers, said at least a first layer comprises at least a portion of a read out integrated circuit (ROIC);
    at least a second layer comprising a least one signal processing circuit, said at least a second layer comprises at least a portion of an ROIC;
    wherein said at least a first layer and said at least a second layer are aligned and interconnected; and
    wherein separate optimized manufacturing processes are used for each of said at least a first layer and said at least a second layer, whereby additional processing cost of said at least a first layer is leveraged, minimizing total device cost and maximizing die count per wafer.

2. The wafer-integration uncooled IR microbolometer FPA sensor device of claim 1, wherein said at least a first layer is a first die vertically aligned and 3D stacked with and connected to said at least a second layer by through silicon vias (TSVs), wherein said at least a second layer is a second die.

3. The wafer-integration uncooled IR microbolometer FPA sensor device of claim 1, wherein said interconnections comprise external interconnects.

4. The wafer-integration uncooled IR microbolometer FPA sensor device of claim 3, wherein said external interconnects comprise wire bonds.

5. The wafer-integration uncooled IR microbolometer FPA sensor device of claim 3, wherein said external interconnects comprise circuit board interconnects.

6. The wafer-integration uncooled IR microbolometer FPA sensor device of claim 1, wherein said at least a second layer comprises an application-specific integrated circuit (ASIC); and
said at least a second layer comprises mixed signal CMOS.

7. The wafer-integration uncooled IR microbolometer FPA sensor device of claim 1, wherein said at least a first layer comprises a first wafer and said at least a second layer comprises a second wafer; wherein said first and second wafers are vertically stacked and interconnected by 3D wafer bonding and integration techniques at wafer level, said integration completed at wafer level.

8. The wafer-integration uncooled IR microbolometer FPA sensor device of claim 1, wherein said uncooled microbolometers of said at least a first layer comprise amorphous silicon.

9. The wafer-integration uncooled IR microbolometer FPA sensor device of claim 1, wherein said at least a first microbolometer layer and said at least a first signal processing layer are aligned side by side.

10. The wafer-integration uncooled IR microbolometer FPA sensor device of claim 1, further comprising a thermal interposer between said at least a first layer and said at least a second layer.

11. The wafer-integration uncooled IR microbolometer FPA sensor device of claim 1, further comprising a discrete electronics layer adjacent said at least a second layer, on side of said at least a second layer opposite said at least a first layer.

12. The wafer-integration uncooled IR microbolometer FPA sensor device of claim 1, comprising vacuum packaging at wafer level.

13. A method of manufacturing a 3D wafer-integration uncooled infrared (IR) microbolometer focal plane array (FPA) sensor comprising the steps of:
fabricating on a first wafer, at least a first die comprising an uncooled IR microbolometer FPA;
fabricating on a second wafer, at least a second die comprising signal-processing circuits, said second wafer comprising at least a second layer, said at least a second layer comprising pixel level corrections, lower read out integrated circuit (ROIC), pixel signal processing, and row based pipeline flow;
aligning said at least a first die and said at least a second die; and
interconnecting said at least a first die and said at least a second die;
wherein separate optimized manufacturing processes are used for each of said fabricating on a first wafer and said fabricating on a second wafer steps; and
whereby additional processing cost of said at least a first die FPA is leveraged, minimizing total device cost and maximizing die count per wafer.

14. The method of claim 13, further comprising
separating from said first wafer, said at least a first die;
separating from said second wafer, said at least a second die;
vertically aligning said at least a first die and said at least a second die;
stacking and interconnecting said at least a first die and said at least a second die using 3D wafer bonding techniques.

15. The method of claim 13, wherein said step of aligning comprises stacking said first wafer and said second wafer; and
wherein said first and second wafers are vertically stacked and interconnected by 3D wafer bonding and integration techniques at wafer level, wherein 3D integration is completed at wafer level.

16. The method of claim 13, further comprising:
a step of providing a discrete electronics layer adjacent said at least a second die, on side opposite said at least a first die;
providing a wafer-lid adjacent said at least a first die, on side opposite said at least a second die; and
providing a thermal interposer between said at least a first die and said at least a second die.

17. The method of claim 13, further comprising the step of providing at least one IR optic adjacent to side of said wafer-lid opposite said at least a second die.

18. A 3D wafer-integration uncooled infrared (IR) microbolometer focal plane array sensor camera comprising:
at least one IR optic component;
an IR transparent wafer-lid comprising a low-activation temperature vacuum getter adjacent said IR optic;
an uncooled infrared microbolometer focal plane array (FPA) silicon layer adjacent said wafer-lid;
said FPA layer comprising 12 micron pitch single-layer vanadium oxide (VOx) bolometer components;
said FPA layer comprising a multiplexer;
said FPA layer comprising read out integrated circuits (ROIC);
said FPA layer comprising high density through silicon via (TSV) 3D interconnects;
at least one low-conductivity silicon thermal interposer comprising a getter and high density TSV 3D interconnects, said low-conductivity thermal interposer adjacent said FPA layer on side of said FPA layer opposite said wafer-lid;
said least one low-conductivity thermal interposer providing thermal management and redistribution between said FPA layer and signal processing portions of said sensor;
an application-specific integrated circuit (ASIC) layer adjacent said low-conductivity thermal interposer;
wherein dimensions of said ASIC layer in plane of said ASIC layer are approximately equal to dimensions of said FPA wafer layer in plane of said FPA layer;
said ASIC layer comprising signal processing circuits;
said signal processing circuits of said ASIC layer comprising video processing circuits;
said video processing circuits of said ASIC layer comprising amplifiers;
said video processing circuits of said ASIC layer comprising at least one A/D converter whereby IR scene produced by said sensor is digitized;
said video processing circuits of said ASIC layer comprising non-uniformity correction (NUC) for gain;
said video processing circuits of said ASIC layer comprising NUC for offset;
a discrete electronics layer substrate adjacent said ASIC layer;
wherein planes of said components and said layers are parallel and said components and said layers are aligned and stacked whereby planar dimensions of said sensor are determined by dimensions of said component or said layer having greatest planar dimensions, thereby reducing footprint of said sensor;

wherein vacuum packaging is at wafer level, location of said TSVs is outside said vacuum packaging; and wherein separate optimized manufacturing processes are used for each said component and said layer, whereby additional processing cost of said FPA layer is leveraged and 3D integration is completed at wafer level, minimizing total cost and maximizing die count per wafer.

* * * * *